(12) United States Patent
DeBoer et al.

(10) Patent No.: US 6,404,005 B1
(45) Date of Patent: *Jun. 11, 2002

(54) METHODS OF FORMING CAPACITORS AND RELATED INTEGRATED CIRCUITRY

(75) Inventors: Scott J. DeBoer, Boise, ID (US); Klaus F. Schuegraf, Tempe, AZ (US); Randhir P. S. Thakur, Bosie, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/823,133

(22) Filed: Mar. 29, 2001

Related U.S. Application Data

(63) Continuation of application No. 09/156,207, filed on Sep. 17, 1998, now Pat. No. 6,222,222.

(51) Int. Cl.[7] .................. H01L 21/108; H01L 29/76; H01L 29/74

(52) U.S. Cl. ........................... 257/309; 438/398

(58) Field of Search ............... 257/309; 438/398

(56) References Cited

U.S. PATENT DOCUMENTS

| | | | |
|---|---|---|---|
| 5,389,568 A | 2/1995 | Yun | |
| 5,418,180 A | 5/1995 | Brown | |
| 5,447,878 A | 9/1995 | Park et al. | |
| 5,554,557 A | 9/1996 | Koh | |
| 5,792,689 A | 8/1998 | Yang et al. | |
| 6,222,222 B1 * | 4/2001 | DeBoer et al. | 257/309 |

* cited by examiner

*Primary Examiner*—Long Pham
*Assistant Examiner*—William David Coleman
(74) *Attorney, Agent, or Firm*—Wells St. John P.S.

(57) ABSTRACT

Capacitor constructions and methods of forming the same are described. In one implementation, a capacitor container is formed over a substrate and includes an internal surface and an external surface. At least some of the external surface is provided to be rougher than at least some of the internal container surface. A capacitor dielectric layer and an outer capacitor plate layer are formed over at least portions of the internal and the external surfaces of the capacitor container. In another implementation, a layer comprising roughened polysilicon is formed over at least some of the external container surface but not over any of the internal container surface. In a preferred aspect, the roughened external surface or roughened polysilicon comprises hemispherical grain polysilicon.

5 Claims, 8 Drawing Sheets

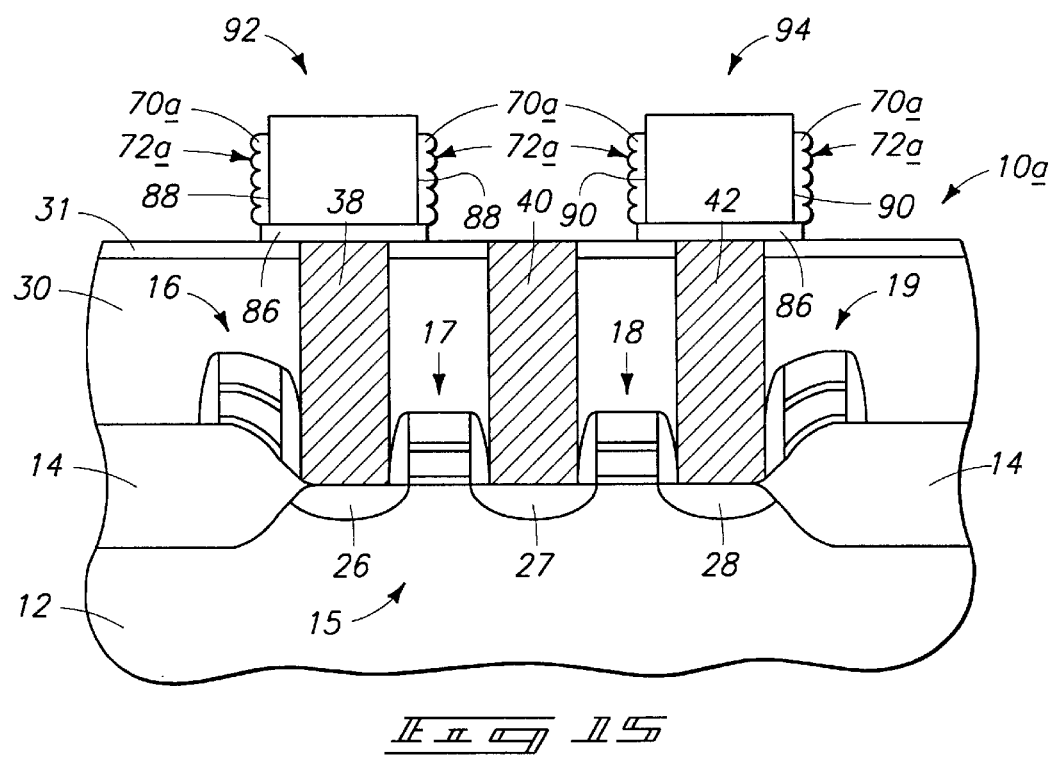
_Fig. 15_
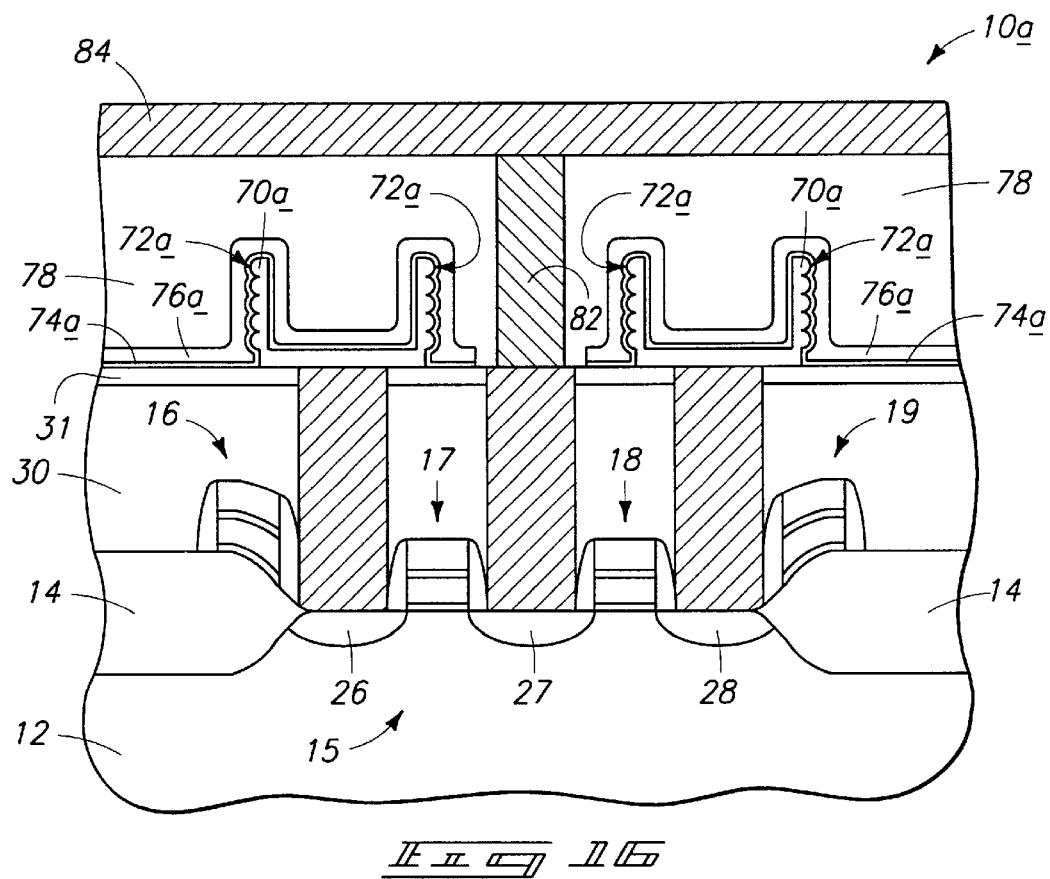
_Fig. 16_

US 6,404,005 B1

METHODS OF FORMING CAPACITORS AND RELATED INTEGRATED CIRCUITRY

This application is a continuation of Ser. No. 09/156,207 filed Sep. 17, 1998 which is now U.S. Pat. No. 6,222,222.

TECHNICAL FIELD

This invention relates to capacitor constructions and to methods for forming capacitors.

BACKGROUND OF THE INVENTION

As semiconductor devices get smaller in size, designers are faced with problems associated with the production of capacitors which are small enough to meet design criteria, yet maintain sufficient capacitance in spite of the smaller size.

One type of capacitor is the container capacitor which is so named for its container-like appearance. Heretofore designers of semiconductor devices, and in particular container capacitors, have focused their attention on increasing the surface area of the inner capacitor plate by means of depositing polysilicon which has a rough surface texture on the inside of the containers. Hemispherical grain polysilicon (HSG) is often utilized for this purpose. This increase in surface area of the inner capacitor plate translates into increased capacitance.

While the use of the technique, such as described above, has worked with some degree of success, there are several aspects of this same and other techniques which have detracted from their usefulness. For example, as contact openings become smaller in size, the use of materials such as HSG polysilicon becomes less attractive because the rough outer surface of such materials facilitates plugging or otherwise occluding smaller contact openings. Accordingly, it becomes necessary to reduce the grain size or roughness of the HSG which, in turn, reduces the area enhancement factor of the film.

One type of integrated circuitry which utilizes capacitors is memory, such as dynamic random access memory (DRAM) circuitry. As DRAMs increase in memory cell density, there is a continuing challenge to maintain sufficiently high storage capacitance despite decreasing cell area. Additionally, there is a continuing goal to further decrease cell area. The principal way of increasing cell capacitance is through cell structure techniques. Such techniques include three-dimensional cell capacitors, such as trenched or stacked capacitors.

This invention arose out of concerns associated with providing integrated circuitry device capacitors having sufficiently high storage capacitance despite decreasing device dimensions. This invention also arose out of concerns associated with providing memory circuitry, and in particular DRAM circuitry, with capacitors having sufficiently high storage capacitance despite decreasing cell area.

SUMMARY OF THE INVENTION

Capacitor constructions and methods of forming the same are described. In one implementation, a capacitor container is formed over a substrate and includes an internal surface and an external surface. At least some of the external surface is provided to be rougher than at least some of the internal container surface. A capacitor dielectric layer and an outer capacitor plate layer are formed over at least portions of the internal and the external surfaces of the capacitor container. In another implementation, a layer comprising roughened polysilicon is formed over at least some of the external container surface but not over any of the internal container surface. In a preferred aspect, the roughened external surface or roughened polysilicon comprises hemispherical grain polysilicon.

BRIEF DESCRIPTION OF THE DRAWINGS

Preferred embodiments of the invention are described below with reference to the following accompanying drawings.

FIG. 15 is a view of the FIG. 12 wafer fragment at a processing step subsequent to that depicted by FIG. 14.

FIG. 16 is a view of the FIG. 12 wafer fragment at a processing step subsequent to that depicted by FIG. 15.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
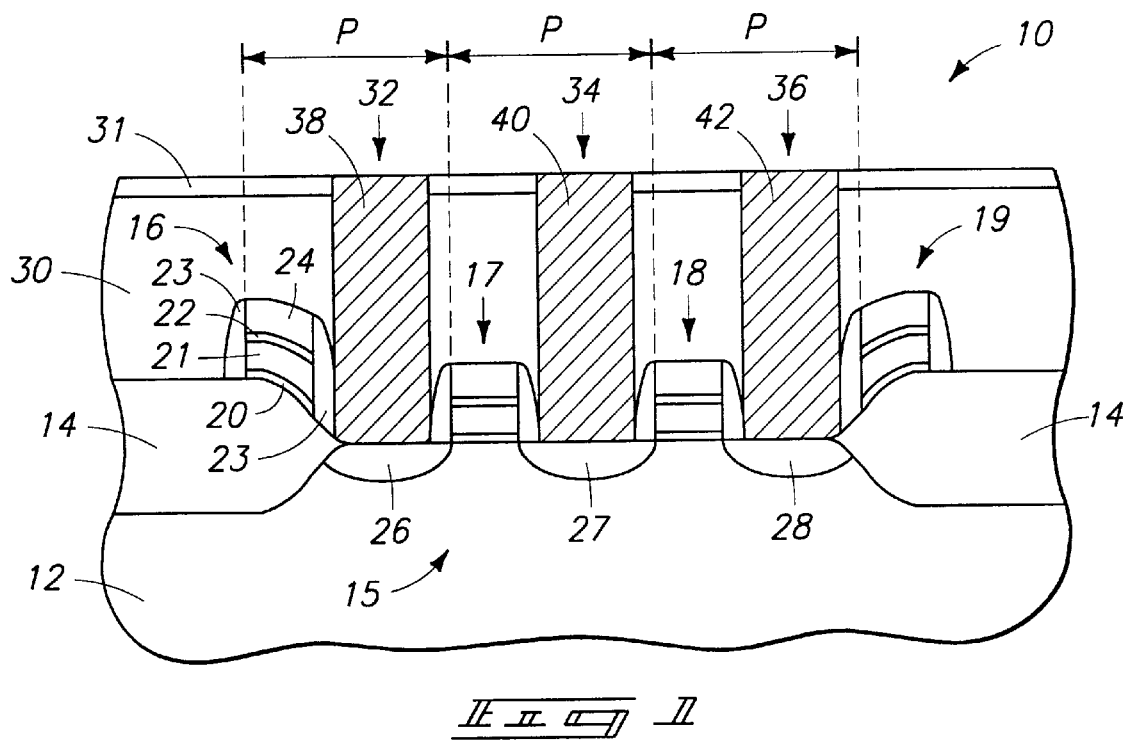
FIG. 1 is a diagrammatic sectional view of a semiconductor wafer fragment at one processing step in accordance with the invention.

Referring to FIG. 1, a semiconductor wafer fragment 10 comprised of a bulk monocrystalline silicon semiconductive substrate 12 and a spaced pair of field oxide regions 14 is shown. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Regions 14 define an active area 15 therebetween. In a preferred aspect of the invention, active area 15 constitutes an area over which dynamic random access memory (DRAM) circuitry constituting portions of a DRAM array are to be formed. It will be understood, however, that other integrated circuitry can be formed utilizing the methodology of the present invention.

A series of four word lines 16, 17, 18, and 19 are provided relative to substrate 12. In the depicted cross-sectional view of wafer fragment 10, word lines 16 and 19 overlie opposing field oxide regions 14, and word lines 17 and 18 constitute a pair of word lines which overlie active area 15. Word lines 16, 17, 18, and 19 respectively comprise a gate dielectric layer 20, and overlying conductively doped polysilicon layer 21, and associated silicide layer 22, electrically insulative sidewall spacers 23, and an insulative cap 24. Such can be of conventional construction, with spacers 23 and cap 24 for example comprising an oxide, nitride, or other electrically insulative material.

Conductively doped diffusion regions 26, 27, and 28 are provided or defined between the conductive lines as shown, and constitute node locations with which electrical communication is desired. According to a preferred aspect of the invention, conductive lines 16, 17, 18, and 19 constitute a repeated pattern of conductive lines within the preferred DRAM array. Such lines preferably have a minimum pitch P of no greater than about 0.6 $\mu$m. In accordance with this disclosure, pitch P is defined as being equal to the smallest distance of a line width plus the width of a space immediately adjacent the line on one side of the line between the line and a next adjacent line in a repeated pattern.

An insulating dielectric material layer 30, preferably of borophosphosilicate glass (BPSG), is provided over the word lines and node locations. If desired, a thin barrier layer (not shown), such as undoped $SiO_2$ deposited by decomposition of tetraethylorthosilicate (TEOS) or a silicon nitride layer, can be provided over the substrate prior to deposition of layer 30 to serve as a shield to undesired boron or phosphorus diffusion from BPSG layer 30 into substrate 12.

An etch stop layer 31 is formed outwardly of insulating dielectric layer 30. Such preferably comprises a material relative to which underlying insulating dielectric layer 30 can be substantially selectively etched, as will be apparent from the continuing description. Exemplary materials for layer 31 include BN, $Si_3N_4$, and oxide formed through decomposition of TEOS. Contact openings 32, 34, and 36 are formed through layers 30, 31 and outwardly expose the respective node locations defined by diffusion regions 26, 27, and 28. Conductive material, such as conductively doped polysilicon, is formed over substrate 12 and within openings 32, 34, and 36 to be in electrical communication with the respective diffusion regions 26, 27, and 28. Accordingly, such forms conductive plugs 38, 40, and 42. The conductive material of plugs 38, 40, and 42 can be and preferably is planarized relative to substrate 12 to isolate the conductive material within each respective contact opening.

Figure 2:
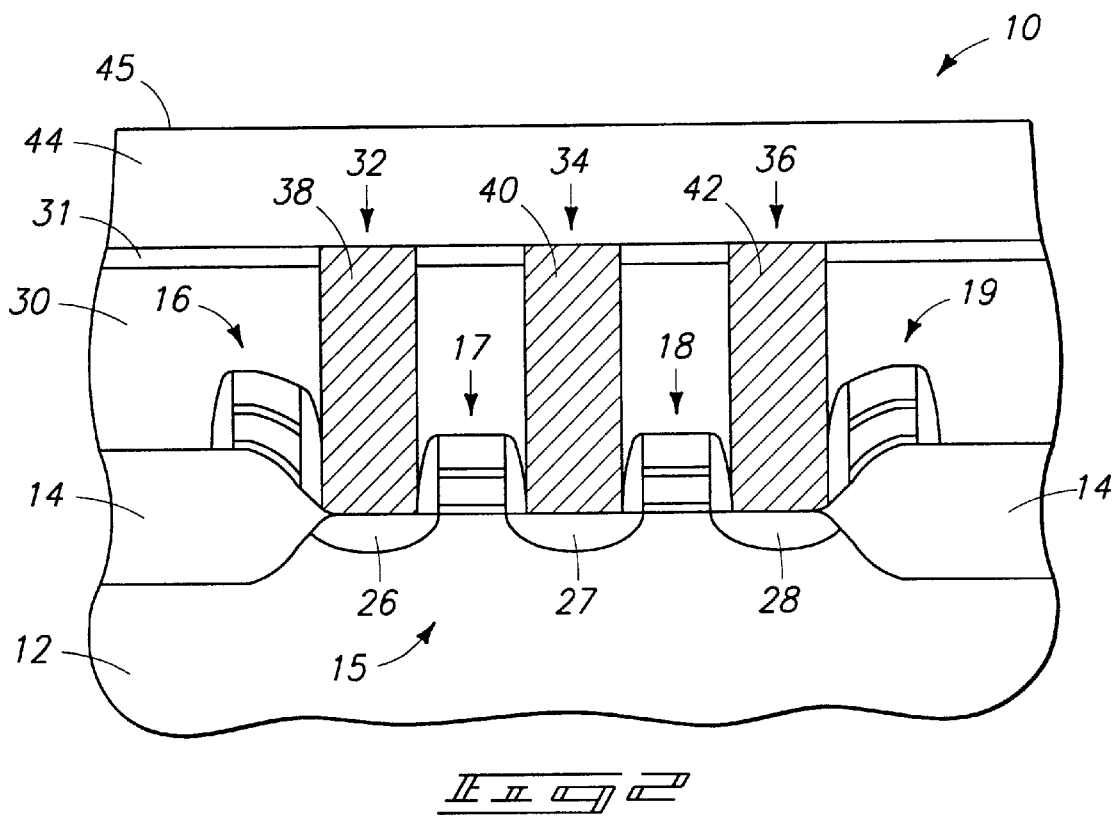
FIG. 2 is a view of the FIG. 1 wafer fragment at a processing step subsequent to that depicted by FIG. 1.

Referring to FIG. 2, a first layer of material 44 is formed over substrate 12 and the node locations defined by respective diffusion regions 26, 27, and 28. First layer 44 preferably comprises an insulative material such as BPSG which is formed to a thickness of about 1 $\mu$m. Layer 44 includes an outer surface 45. For purposes which will become apparent, first layer 44 constitutes a support wall material layer which is formed over substrate 12. Layer 44 also constitutes, in accordance with another aspect of the invention, a capacitor container support layer.

Figure 3:
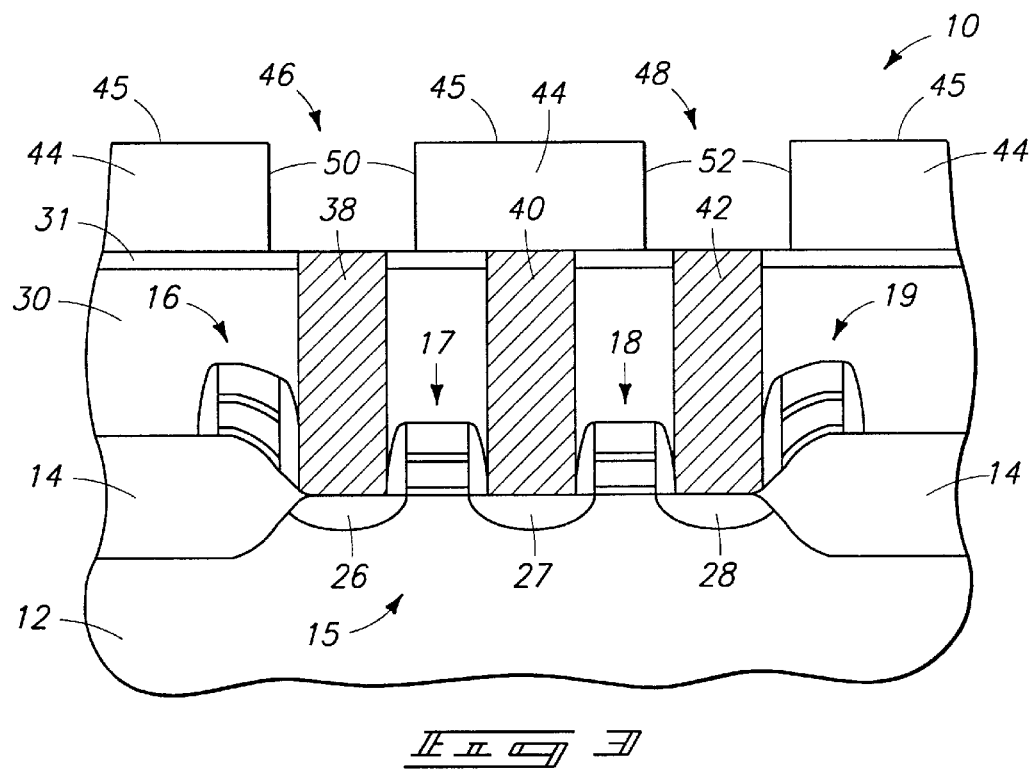
FIG. 3 is a view of the FIG. 1 wafer fragment at a processing step subsequent to that depicted by FIG. 2.

Referring to FIG. 3, openings 46, 48 are formed in layer 44. Preferably, such openings are patterned and etched through outer surface 45 to outwardly expose conductive plugs 38, 42 as shown. For purposes of the ongoing discussion, conductive plugs 38, 42 constitute node locations with which electrical communication is desired. In accordance with one aspect of the invention, support walls 50, 52 are provided over substrate 12 proximate an area in which corresponding capacitor containers are to be formed. Exemplary support walls 50, 52 constitute respective pairs of inwardly-facing sidewalls. In a preferred implementation for 0.6 $\mu$m pitch, the dimensions of openings 46, 48 are less than or equal to about 0.5 $\mu$m×0.35 $\mu$m.

Figure 4:
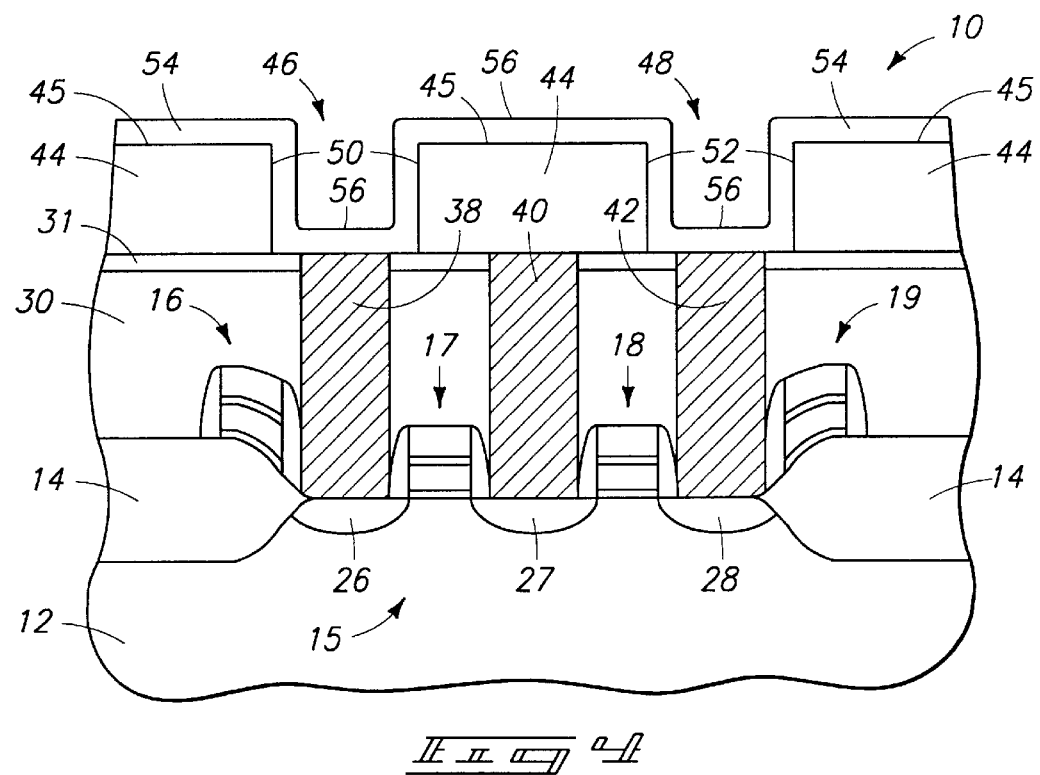
FIG. 4 is a view of the FIG. 1 wafer fragment at a processing step subsequent to that depicted by FIG. 3.

Referring to FIG. 4, a second layer of material 54 is formed over substrate 12 and less than fills respective openings 46, 48. In accordance with one aspect of the invention, layer 54 constitutes a silicon-containing capacitor container structure which is formed over corresponding support walls 50, 52. Preferably, such layer is in conductive electrical communication with the respective underlying conductive plugs 38, 42 as deposited. In accordance with a preferred aspect of the invention, such layer constitutes a layer of amorphous silicon which is formed to a thickness from between 300 Angstroms to 1000 Angstroms inclusive, and at temperatures from between about 450° C. to 650° C. Such layer, or at least portions thereof, will ultimately be rendered into polysilicon during downstream processing. As shown, layer 54 includes an outer surface 56. For purposes of the ongoing discussion and in accordance with one aspect of the invention, material of layer 54 which is disposed inside opening 46, 48 and over support walls 50, 52 constitutes respective capacitor containers. Accordingly, that portion of outer surface 56 of layer 54 which is disposed within openings 46, 48 constitutes respective capacitor container inner or internal surfaces. The internal surfaces define openings which are smaller in dimension than openings 46, 48.

Figure 5:
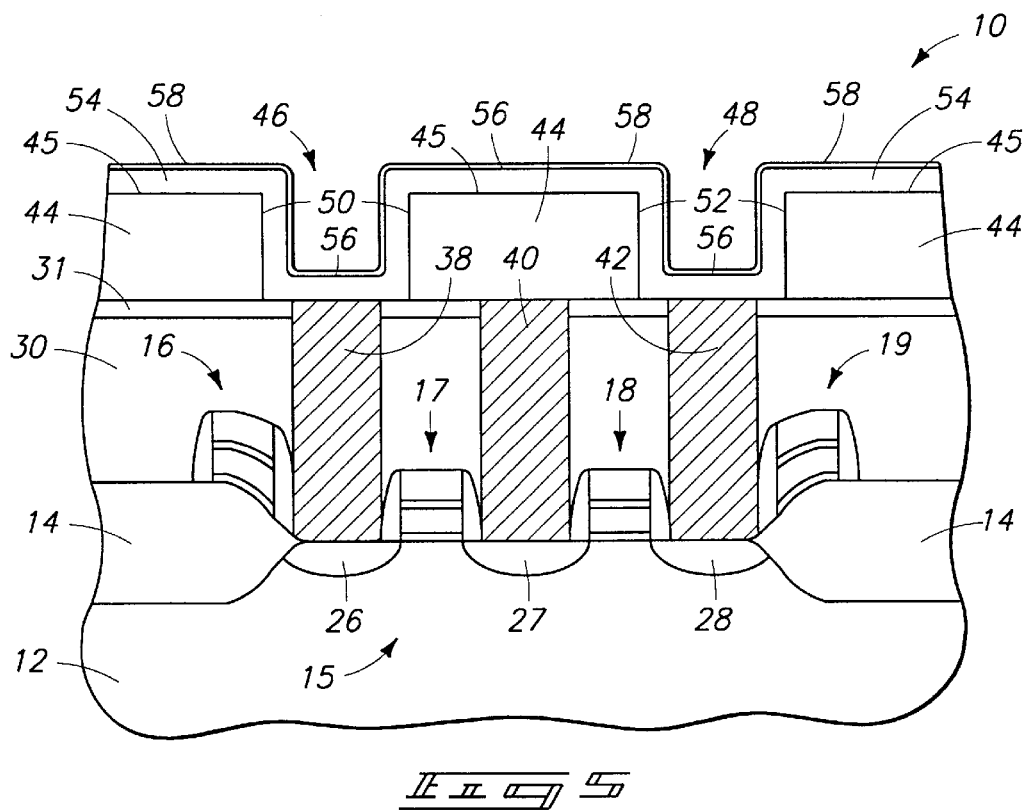
FIG. 5 is a view of the FIG. 1 wafer fragment at a processing step subsequent to that depicted by FIG. 4.

Referring to FIG. 5, a third layer of material 58 is formed over second layer 54 and preferably constitutes a material which is different from the material from which second layer 54 is formed. In a preferred implementation, third layer 58 constitutes a masking layer which is insulative in nature and formed within the openings defined by the capacitor container inner surfaces to less than fill the openings.

In accordance with one aspect of the invention, layer 58 constitutes an oxide-containing material. An exemplary material is an oxide formed through decomposition of TEOS which is formed to a thickness of less than about 100 Angstroms. Where layer 54 comprises amorphous silicon, the formation of layer 58 is preferably carried out at a temperature which is low enough, e.g. 550° C., such that the amorphous silicon is not rendered into polysilicon.

In accordance with another aspect of the invention, layer 58 constitutes a nitride-containing material. An exemplary material is silicon nitride which is formed through low pressure chemical vapor deposition (LPCVD) techniques to a thickness of less than about 20 Angstroms. Alternatively, rapid thermal nitridation techniques, which are self-limiting in nature, can be utilized to form a layer comprising $NH_3$ or $N_2H_4$ to a thickness of less than 100 Angstroms, and closer to 30 Angstroms. Where layer 54 comprises amorphous silicon, the formation of layer 58 is preferably carried out at a temperature which is low enough, e.g. 550° C., such that the amorphous silicon is not rendered into polysilicon.

Figure 6:
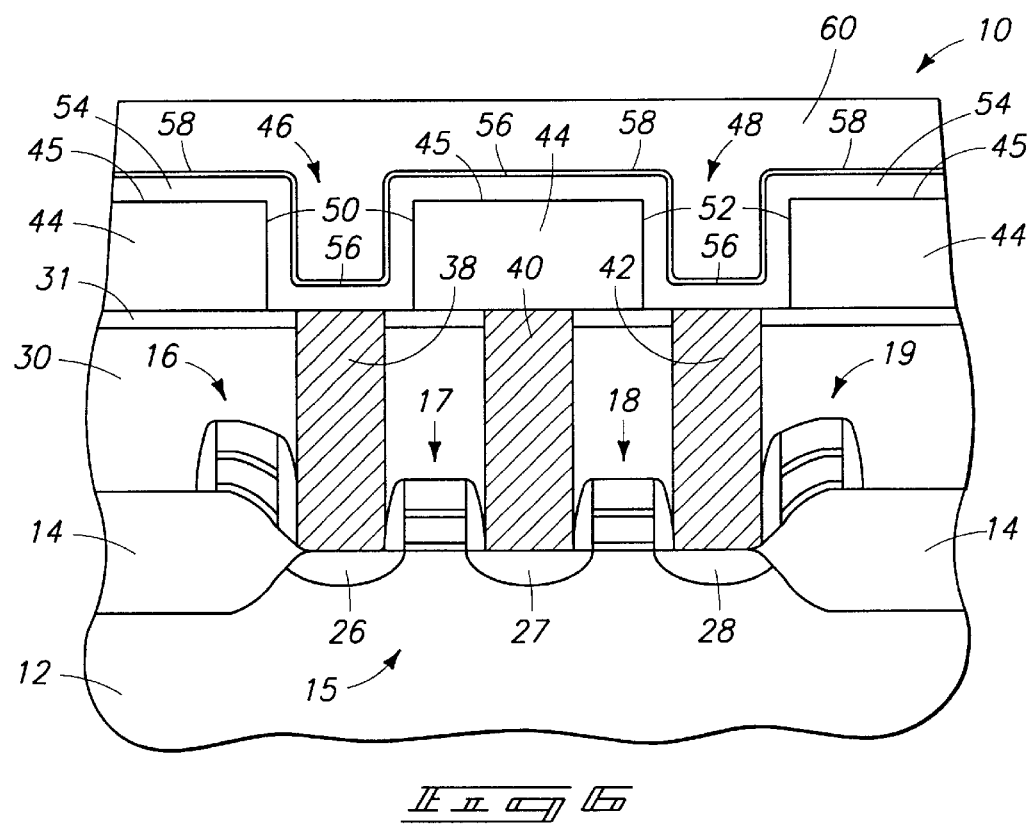
FIG. 6 is a view of the FIG. 1 wafer fragment at a processing step subsequent to that depicted by FIG. 5.

Referring to FIG. 6, and in accordance with one aspect of the invention, the remaining openings are filled through provision of a layer 60 which is formed over substrate 12. Preferably, layer 60 completely fills any of remaining openings 46, 48. An exemplary and preferred material for layer 60 is photoresist.

Figure 7:
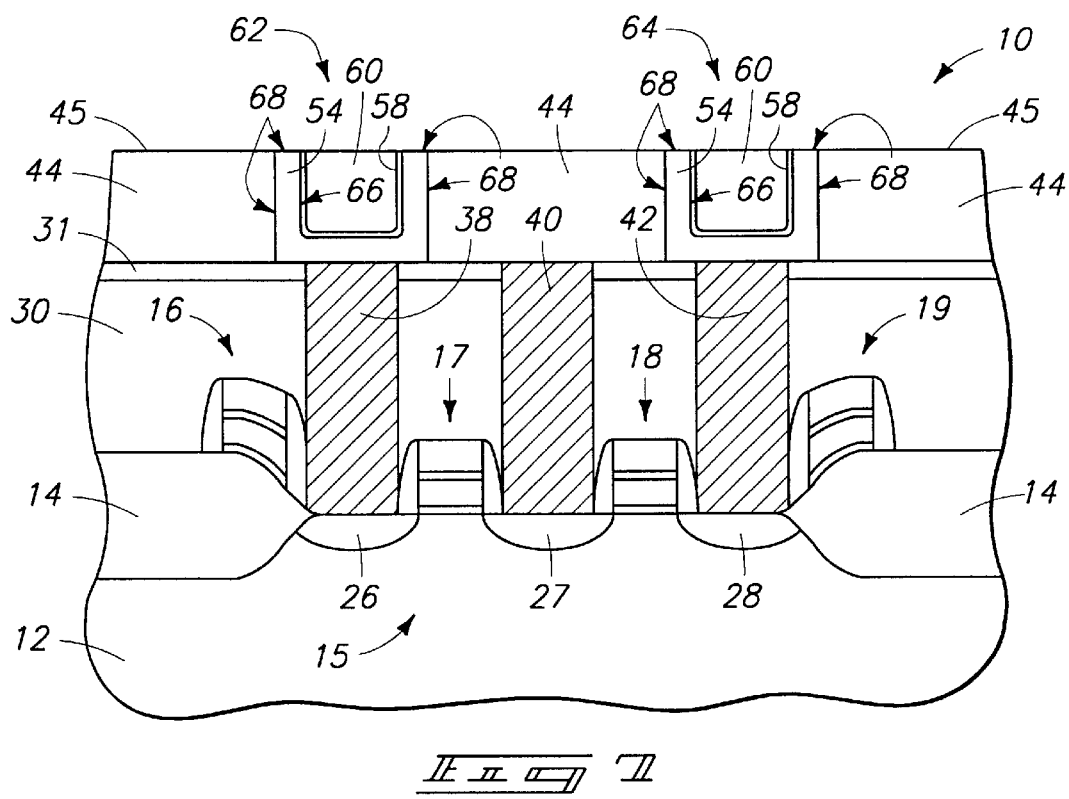
FIG. 7 is a view of the FIG. 1 wafer fragment at a processing step subsequent to that depicted by FIG. 6.

Referring to FIG. 7, capacitor containers 62, 64 are more clearly defined or formed over substrate 12. In one aspect of the invention, capacitor containers 62, 64 are formed by removing suitable amounts of photoresist 60, second layer 54, and third layer 58. Such can be accomplished through a resist etch back procedure or through planarizing such material. In the latter case, second layer 54, third layer 58, and photoresist 60 are planarized relative to outer surface 45 of first layer 44. Such can be accomplished through chemical mechanical polishing of the substrate. The capacitor containers thus formed include an internal surface 66 and an external or outer surface 68. For purposes of the ongoing discussion, the capacitor container outer surface does not include that portion of layer 58 which is outwardly exposed and coincident with the illustrated outwardly exposed outer surface 68 of layer 54. Internal surface 66 corresponds to the capacitor container inner surface mentioned above.

Figure 8:
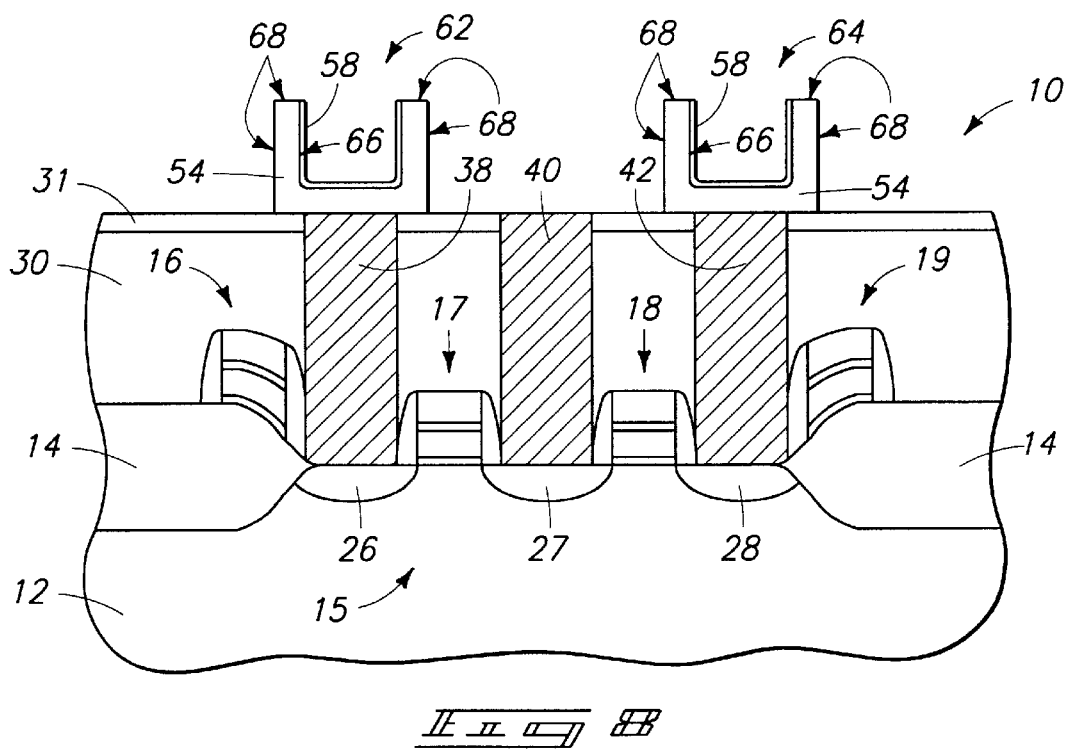
FIG. 8 is a view of the FIG. 1 wafer fragment at a processing step subsequent to that depicted by FIG. 7.

Referring to FIG. 8, material of first layer 44 is removed from laterally proximate second layer material 54 to outwardly expose the material of second layer 54. Accordingly, external or outer surfaces 68 of capacitor containers 62, 64 are outwardly exposed. An exemplary removal technique to remove layer 44 material includes subjecting the same to a BPSG strip or etch utilizing an exemplary chemistry which includes liquid or vapor HF at a 10:1 concentration ($HF:H_2O$) by volume. Photoresist material 60 is then removed utilizing a conventional photoresist stripping composition.

Figure 9:
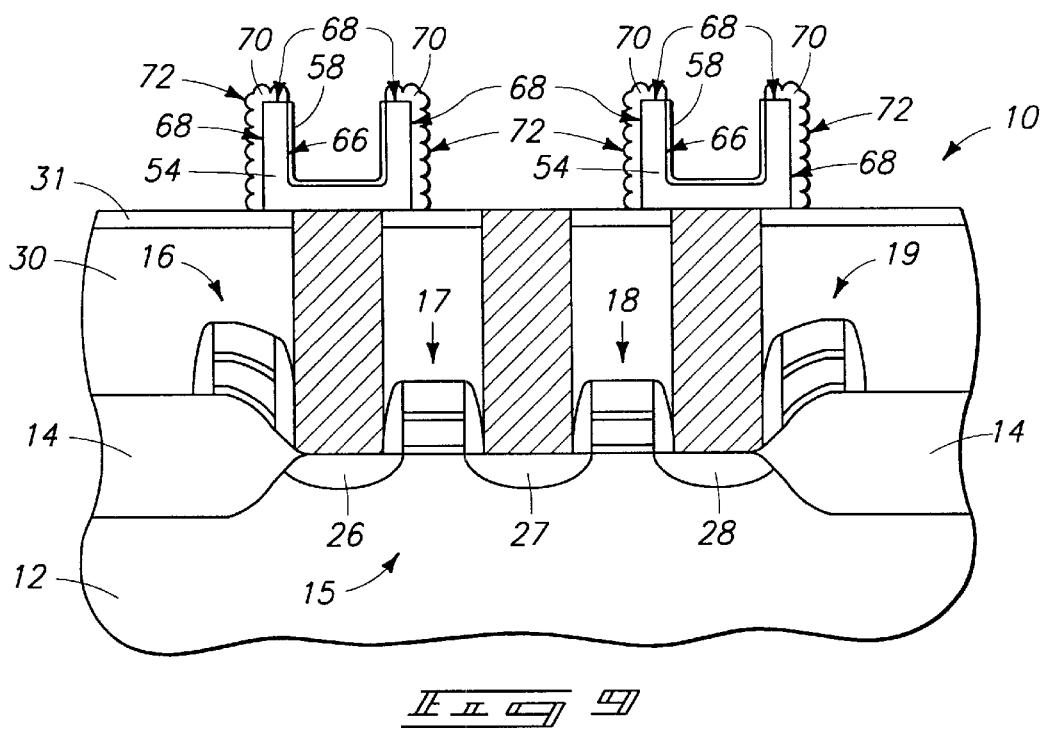
FIG. 9 is a view of the FIG. 1 wafer fragment at a processing step subsequent to that depicted by FIG. 8.

Referring to FIG. 9, a fourth layer of material 70 is formed over exposed second layer 54 material. Fourth layer 70 includes an outer surface 72 which is provided to be rougher than internal or inner surface 66. In a preferred aspect of the invention, fourth layer 70 constitutes roughened or rugged polysilicon. An exemplary and preferred material for fourth layer 70 is hemispherical grain polysilicon (HSG). Accordingly, layer 70 constitutes a layer comprising rugged polysilicon which is formed over external surface 68 but not over any of internal or inner surface 66. Alternately considered, layer 70 is formed over a predominate portion of, and preferably all of external surface 68 but not over a predominate portion of internal surface 66. Accordingly, internal surface 66 is masked by masking layer 58 which prevents layer 70 material from being deposited or formed thereover. Accordingly, layer 70 material is deposited or formed over the unmasked external surface 68. Preferably, the entirety of internal surface 66 is masked with masking layer 58.

The above methodology constitutes one in which capacitor containers 62, 64 are exposed to conditions which are effective to form a layer of conductive material, e.g. layer 70, over at least some of outer surface 68 and not over any of inner surface 66. The exemplary and preferred HSG polysilicon which constitutes layer 70 material can be formed through a low pressure chemical vapor deposition of silicon seeds using silane at a very low partial pressure (i.e., less than 1% with an inert carrier gas such as $N_2$, He, or Ar). Such provides either a discontinuous or thin nucleation layer of silicon seeds. Thereafter, the substrate can be annealed at a temperature which is sufficient to render the illustrated HSG polysilicon layer. An exemplary temperature is greater than or equal to 450° C. A preferred temperature is about 560° C. Such temperature preferably transforms at least the outermost portion of the silicon seeds and immediately adjacent and previously-formed amorphous silicon of layer 54 into polysilicon. The remaining amorphous silicon can be transformed to polysilicon during the HSG formation, or such can be rendered into polysilicon at a subsequent downstream processing step.

Figure 10:
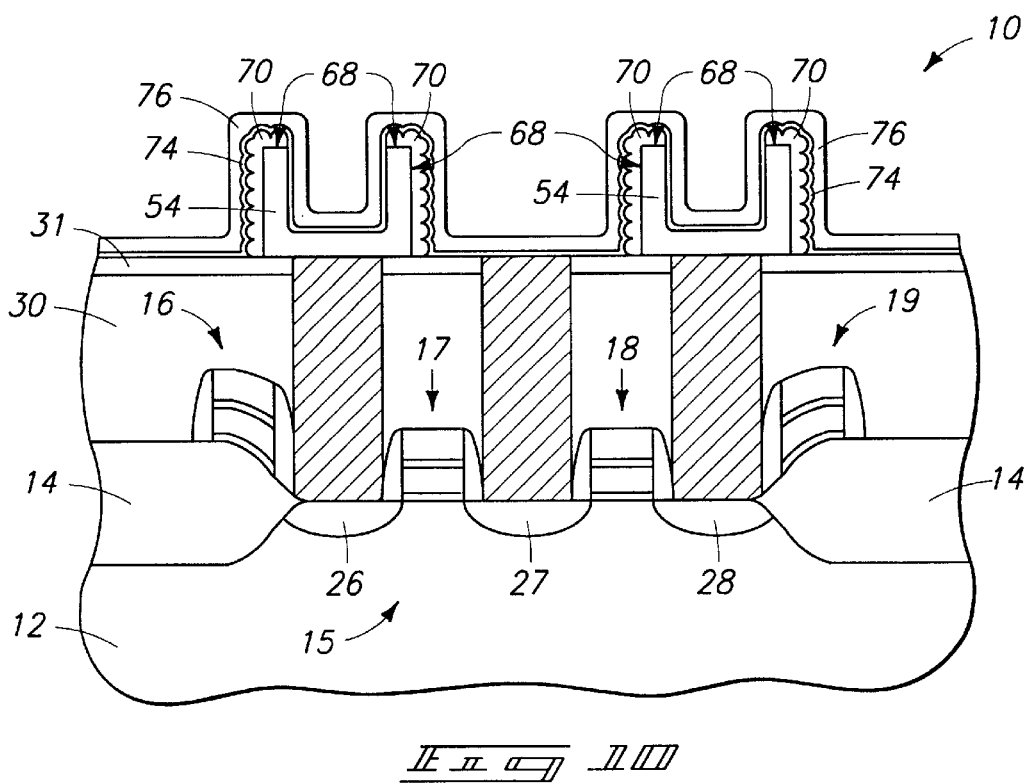
FIG. 10 is a view of the FIG. 1 wafer fragment at a processing step subsequent to that depicted by FIG. 9.

Referring to FIG. 10, and after the capacitor containers are exposed to the conditions which form layer 70, a capacitor dielectric layer 74 is formed over the substrate and operably proximate layers 54 and 70. Subsequently, a capacitor plate layer 76 is formed operably adjacent capacitor dielectric layer 74. In a preferred implementation, capacitor plate layer 76 constitutes a cell plate layer for the preferred DRAM array.

In accordance with that aspect of the invention in which masking layer 58 is formed from an oxide-containing material such as the exemplary oxide formed through decomposition of TEOS, such can be, and preferably is removed prior to formation of the illustrated capacitor dielectric layer. Such can be accomplished through a conventional pre-nitride deposition cleaning step. A subsequent capacitor dielectric layer can then be provided as described above.

In accordance with that aspect of the invention in which masking layer 58 is formed from a nitride-containing material, such as by rapid thermal nitridation, such layer would, as discussed above, be produced to a self-limiting thickness of around 30 Angstroms. Accordingly, and in order to achieve uniform nitride layer thickness over all of the outer surfaces of layers 54 and 70, substrate 12 could be further subjected to rapid thermal nitridation to grow a 30-Angstrom thick layer of silicon nitride over areas of layers 54, 70 where such nitride is not previously formed. Such would, however, form a nitride thickness which is self-limited to a thickness of about 30 Angstroms. Because of the self-limiting nature of the rapid thermal nitridation techniques, the thickness of the masking layer over internal surface 66 would not be further meaningfully increased. A subsequent low pressure chemical vapor deposition step can be utilized to form a nitride layer which achieves a uniform and thicker dielectric layer over all of the effected surfaces of layers 54, 70. A desired capacitor dielectric layer can also be formed through deposition of a thin film layer of $Ta_2O_5$ over the nitride layer.

Figure 11:
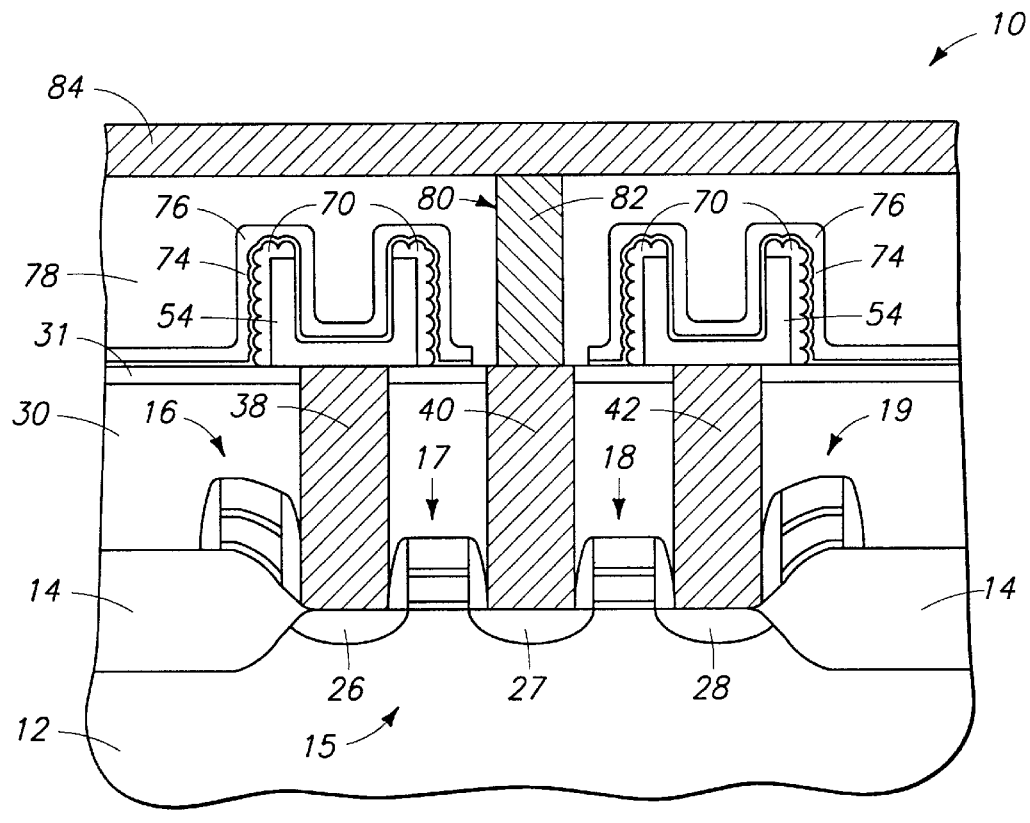
FIG. 11 is a view of the FIG. 1 wafer fragment at a processing step subsequent to that depicted by FIG. 10.

Referring to FIG. 11, layers 74 and 76 are patterned and etched to provide resultant capacitor constructions. A layer 78 is formed over substrate 12 and preferably constitutes an insulative material such as BPSG. A contact opening 80 is provided through layer 78 and forms an operative connection with conductive plug 40. Opening 80 is subsequently filled with conductive material to provide, together with conductive plug 40, a bit line contact plug 82 to the node location defined by diffusion region 27. Subsequently, a bit line 84 is formed to be in operative connection with bit line contact plug 82. In the preferred embodiment, such constitutes a portion of a DRAM array.

The above constitutes but one exemplary integrated circuitry construction which, in a preferred implementation, comprises a portion of a DRAM array. It is to be understood that the invented methodology can be employed in processing scenarios in which integrated circuitry, other than memory circuitry, is desired to be formed. The invented methodology is useful in that it increases the capacitor plate surface area (and hence the capacitance potential) without the risk of closing off or otherwise encumbering the area internally of the capacitor container. Area is also gained internally of the capacitor container by maintaining a generally smoother surface area as compared with the surface area provided by the roughened or rugged polysilicon. In addition, because the preferred HSG polysilicon is formed relative to the outer surface of the capacitor containers rather than the inner or interior surfaces, grain sizes can be formed which are larger than would otherwise be possible if the HSG polysilicon were to be formed over the inner surfaces. Accordingly, this increases the available surface area for providing increased capacitance.

Referring to FIGS. 12–16, an alternate embodiment is set forth generally at 10a. Like numbers from the first-described embodiment have been utilized where appropriate, with differences being indicated by the suffix "a" or with different numerals.

Figure 12:
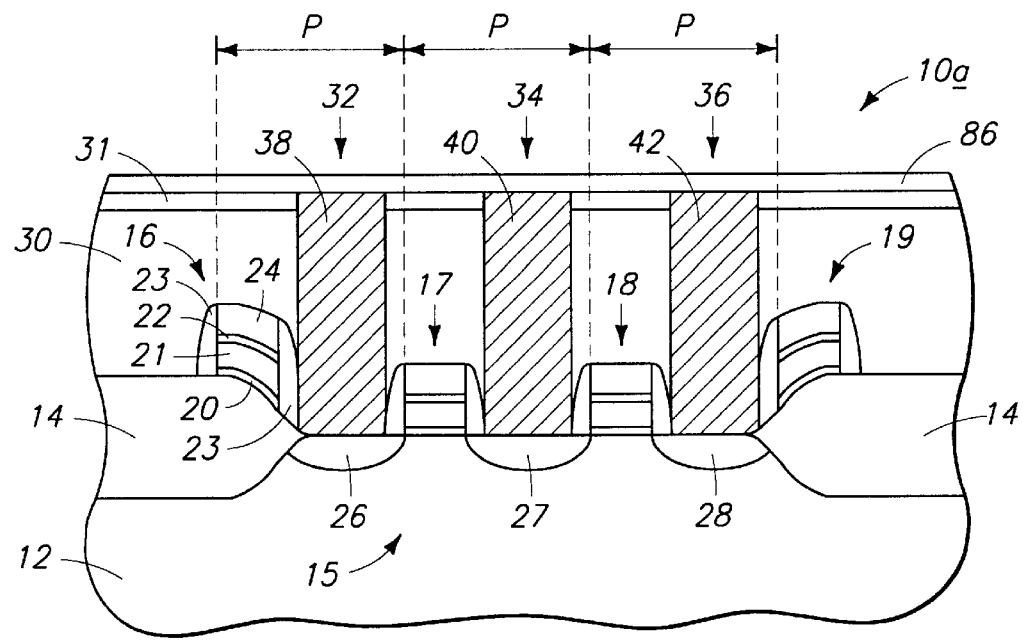
FIG. 12 is a diagrammatic sectional view of an alternate embodiment semiconductor wafer fragment at one alternate processing step in accordance with the invention.

Referring to FIG. 12, a conductive layer of material 86 is formed over the substrate. In a preferred implementation, such constitutes conductively doped polysilicon.

Figure 13:
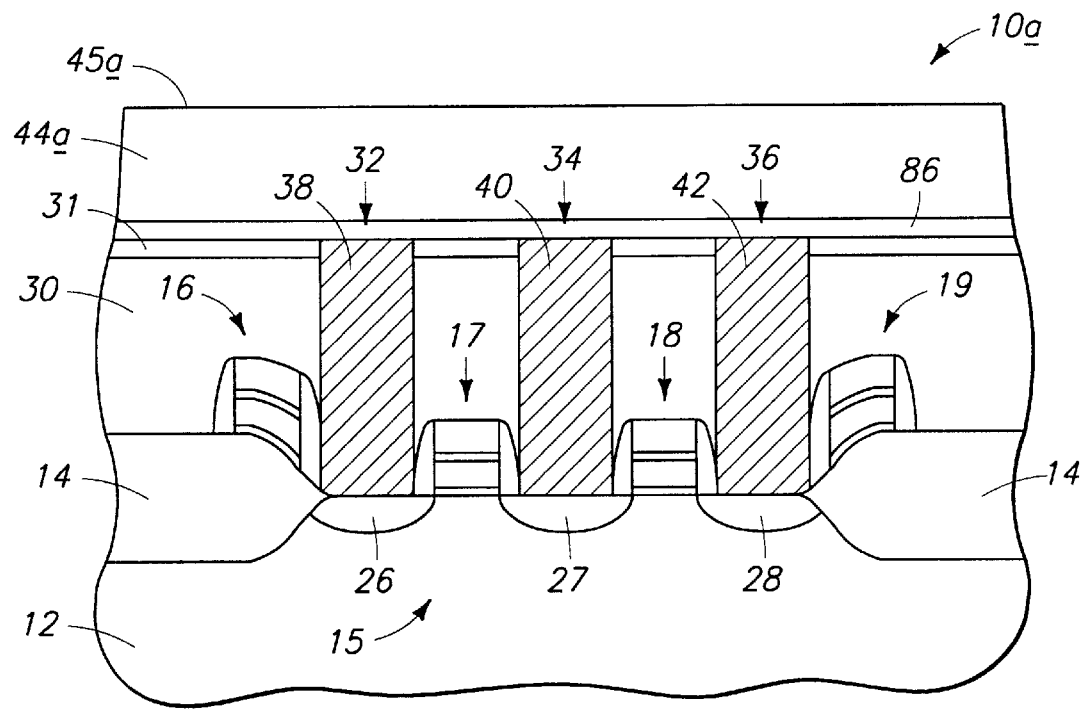
FIG. 13 is a view of the FIG. 12 wafer fragment at a processing step subsequent to that depicted by FIG. 12.

Referring to FIG. 13, support wall material layer 44a is formed over layer 86.

Figure 14:
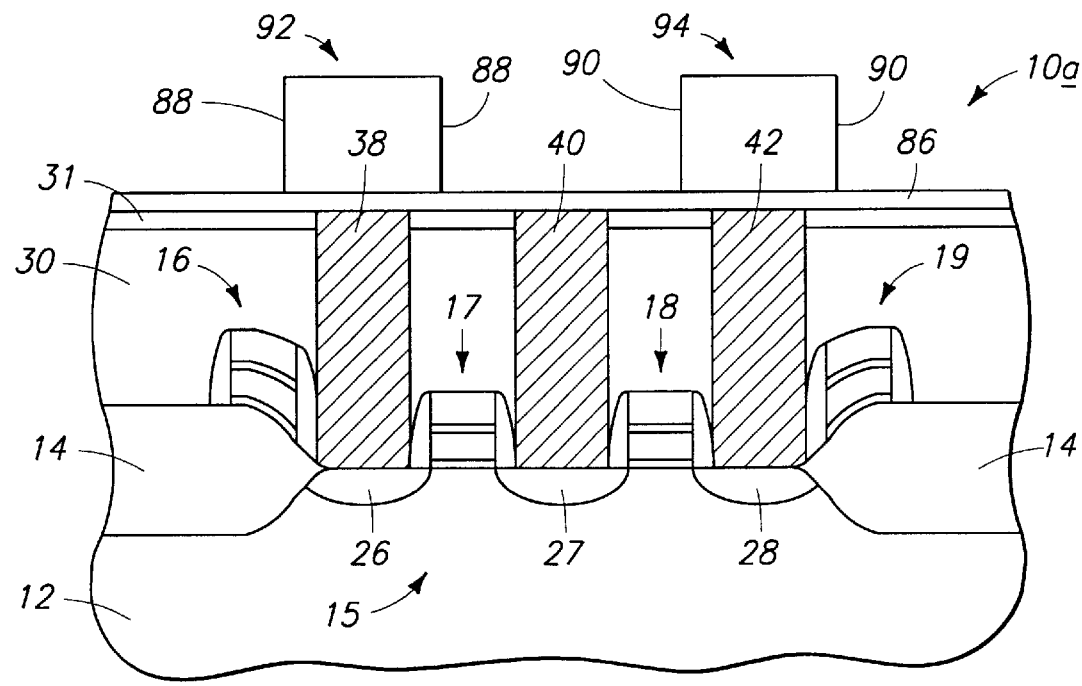
FIG. 14 is a view of the FIG. 12 wafer fragment at a processing step subsequent to that depicted by FIG. 13.

Referring to FIG. 14, support wall material layer 44a is patterned and etched to define individual pairs of laterally outwardly-facing sidewalls or support walls 88, 90 which extend generally away from layer 86. In one aspect, the support wall material layer constitutes an insulative material such as BPSG which is subsequently patterned and etched to form insulative material blocks 92, 94 having outer surfaces which include, respectively sidewalls 88, 90.

Referring to FIG. 15, silicon-containing capacitor container structures 70a are formed over the outer surfaces of blocks 92, 94. The illustrated and preferred structures 70a are formed over support walls 88, 90 and include outer surfaces 72a. Preferably, structures 70a constitute roughened or rugged polysilicon. Even more preferably, such constitutes HSG polysilicon. Structures 70a can be fabricated, for example, by deposition and subsequent anisotropic etch of a polysilicon or amorphous silicon layer. This leaves portions of layer 86 elevationally between and in operative contact with structures 70a and plugs 38, 42 respectively.

Referring to FIG. 16, support wall material laterally inwardly of outer surfaces 72a is removed, preferably through a suitable oxide etch which is conducted selectively relative to the material from which structures 70a are formed. Accordingly, blocks 92, 94 are removed. Subsequently, a capacitor dielectric layer 74a and an outer capacitor plate layer 76a are formed operably proximate structures 70a. Subsequent processing to form the illustrated DRAM storage capacitors is substantially as described above with reference to the first-described embodiment.

Briefly summarizing, a preferred aspect of the invention provides methods and resultant container capacitor structures which have a smooth interior and a rough exterior. The rough exterior, in a preferred implementation, is provided relative to an inner capacitor plate. In such implementation, the inner capacitor plate comprises an inner container capacitor plate having a smooth interior and a rough exterior. The methods and the resultant structures realize a desired capacitance while overcoming a problem associated with the dimensions of such structures growing smaller and smaller, e.g. closing off the interior of the container capacitors.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A capacitor comprising:
   a substrate;
   a conductive plug electrically coupled to a conductive node in the substrate;
   a capacitor container disposed over and in electrical communication with the conductive plug, the capacitor container having an internal surface and an external surface, essentially all of the external surface being rougher than any of the internal surface; and
   a capacitor dielectric layer and an outer capacitor plate layer disposed over at least portions of the internal and external surfaces of the capacitor container.

2. A capacitor comprising:
   a substrate;
   a conductive plug electrically coupled to a conductive node in the substrate;
   a capacitor container disposed over and in electrical communication with the conductive plug, the capacitor container having an internal surface and an external surface;
   a layer comprising rugged polysilicon disposed over a predominate portion of the external container surface but not disposed over any portion of the internal container surface; and
   a capacitor dielectric layer and an outer capacitor plate layer disposed over the rugged polysilicon and at least some of the internal container surface.

3. A capacitor comprising:
   a substrate;
   a conductive plug electrically coupled to a conductive node in the substrate;
   a capacitor container disposed over and in electrical communication with the conductive plug, the container having inwardly facing surfaces and outwardly facing surfaces, all the inwardly facing surfaces being essentially perpendicular to a major surface of the substrate; and
   a layer of a rugged conductive material disposed over essentially all of the outwardly facing surfaces and not over any of the inwardly facing surfaces.

4. DRAM circuitry comprising:
   a substrate;
   at least two conductive lines disposed over the substrate, the conductive lines defining therebetween a node location with which electrical communication is desired;
   a conductive plug over and in electrical communication with the node location;
   a capacitor container disposed over and electrically coupled to the conductive plug over the substrate node location, the capacitor container having an internal surface and an external surface, wherein essentially all of the external surface being rougher than any of the internal surface; and
   a capacitor dielectric layer and an outer capacitor plate layer disposed over at least portions of the internal and the external surfaces of the capacitor container.

5. A DRAM array comprising:
   a substrate;
   a plurality of conductive lines disposed over the substrate, at least some of the conductive lines defining therebetween node locations with which electrical communication is desired;

a plurality of conductive plugs, individual conductive plugs disposed over and in electrical communication with individual node locations;

a plurality of capacitor containers over and electrically coupled to individual conductive plugs, the capacitor containers having inwardly facing surfaces and outwardly surfaces, all the inwardly facing surfaces being essentially perpendicular to a major surface of the substrate, and further having a layer of a rugged conductive material disposed over essentially all of the outwardly facing surfaces and not over any of the inwardly facing surfaces; and a capacitor dielectric layer and an outer capacitor plate layer over at least portions of the inwardly facing surfaces and outwardly surfaces of the capacitor containers.

* * * * *